(12) United States Patent
Kim et al.

(10) Patent No.: US 7,714,421 B2
(45) Date of Patent: May 11, 2010

(54) SMALL STRUCTURE AND METHOD FOR FABRICATING THE SAME

(75) Inventors: Jong-pal Kim, Seoul (KR); Yong-chul Cho, Suwon-si (KR); Byeung-leul Lee, Yongin-si (KR); Sang-woo Lee, Seoul (KR); Joon-hyock Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 550 days.

(21) Appl. No.: 11/192,358

(22) Filed: Jul. 29, 2005

(65) Prior Publication Data

US 2006/0022322 A1 Feb. 2, 2006

(30) Foreign Application Priority Data

Jul. 29, 2004 (KR) .................... 10-2004-0059969

(51) Int. Cl.
*H01L 23/02* (2006.01)
(52) U.S. Cl. .............. 257/678; 257/417; 257/418; 257/419; 257/E29.167; 257/E29.324; 438/51; 438/52; 438/120; 438/127
(58) Field of Classification Search .......... 438/51, 438/52, 120, 127; 257/E29.167, E29.324, 257/417, 418, 419, 678
See application file for complete search history.

(56) References Cited

U.S. PATENT DOCUMENTS 5,313,835 A * 5/1994 Dunn .................. 73/514.15
6,058,777 A * 5/2000 Fujimoto et al. ......... 73/504.12
6,225,145 B1 * 5/2001 Choi et al. .................. 438/120
6,274,823 B1 * 8/2001 Khandros et al. ........... 174/261
6,391,673 B1 * 5/2002 Ha et al. ...................... 438/51
6,465,280 B1   10/2002 Martin et al.
6,698,292 B2 * 3/2004 Kikuchi ...................... 73/662
7,000,472 B2 * 2/2006 Kinoshita ................. 73/504.12
7,091,651 B2 * 8/2006 Kinoshita .................... 310/365
2002/0117330 A1 * 8/2002 Eldridge et al. ............. 174/260
2003/0141340 A1 * 7/2003 Ishikawa et al. ............. 228/4.5
2005/0116794 A1 * 6/2005 Mizuno ...................... 333/187
2006/0053883 A1 * 3/2006 Hayashi et al. .......... 73/504.12
2006/0258039 A1 * 11/2006 Lutz et al. .................... 438/50

* cited by examiner

*Primary Examiner*—Eugene Lee
*Assistant Examiner*—Peniel M Gumedzoe
(74) *Attorney, Agent, or Firm*—Sughrue Mion, PLLC

(57) ABSTRACT

A small structure which uses bonding wires to prevent disturbance and provide support and a method of fabricating the same are provided. The small structure includes a floating body having a plurality of first contact pads, a base having a plurality of second contact pads, and a plurality of bonding wires electrically connecting the first and second contact pads and elastically supporting the floating body. The method of fabricating the small structure includes preparing a base, forming a sacrificial layer on the base, disposing a floating body on the sacrificial layer, connecting the base and the floating body with bonding wires, and removing the sacrificial layer. Thereby, fabrication costs of the small structure are reduced.

8 Claims, 14 Drawing Sheets

SMALL STRUCTURE AND METHOD FOR FABRICATING THE SAME

CROSS-REFERENCE TO RELATED APPLICATIONS

This application claims priority from Korean Patent Application No. 2004-59969, filed on Jul. 29, 2004, the entire disclosure of which is incorporated herein by reference.

BACKGROUND OF THE INVENTION

1. Field of the Invention

Apparatuses and methods consistent with the present invention relate to a small structure such as a gyroscope, an accelerometer, a micro-mirror and so forth, and a method for fabricating the same, and more particularly to a small structure having a floating body and a method for fabricating the same.

2. Description of the Related Art

In general, a small structure using microelectromechanical technology, such as a gyroscope, an accelerometer and a micro-mirror is provided with a mass, such as a vibration piece, which constantly vibrates or rotates in a first axial direction. When such a mass rotates in a second axial direction perpendicular to the first axial direction at a constant angular velocity, the mass generates a coriolis force in a third axial direction, which is perpendicular to the first and second axial direction. According to this coriolis force, the mass generates a minute displacement, for example between tens of nanometers and several nanometers. This displacement is sensed by variation of capacitance, and detected as a rotational angular velocity.

However, this gyroscope is generally used under the exposure to a disturbance, such as noise, impact etc., other than the rotational angular velocity. When this type of disturbance acts on the gyroscope, the mass of the gyroscope generates displacement due to translational acceleration. As a result, a certain component of the displacement caused by the translational acceleration causes the mass to be displaced in the sensing direction, so that undesired signals are detected.

Therefore, the gyroscope is essentially required to isolate the mass from the disturbance such as noise, impact etc. introduced from an external environment.

Referring to FIG. 1, there is illustrated a general gyroscope 1, wherein an oscillator including an oscillating piece as a mass is isolated from a disturbance by means of an resilient member.

The gyroscope 1 is composed of a resilient member 4 enclosing an oscillator 2 and a printed circuit base (PCB) 3, and a housing 5 which receives the resilient member 4.

In this conventional gyroscope 1, the resilient member 4 is sealed in the housing 5 in a slightly compressed state so as not to move in the housing 5. Hence, when the resilient member 4, which encloses the oscillator 2 and the PCB 3, is sealed in the housing 5, a force applied to the oscillator 2 by the resilient member 4 is varied before and after sealing, so that the gyroscope is changed in output after sealing.

For this reason, in order to adjust the output after sealing, the gyroscope 1 should provide an output adjusting hole for the housing 5. As a result, the housing 5 fails to insulate a noise, etc.

In order to improve this problem, there has been proposed a gyroscope 1' having a structure such that no force is applied to a resilient member when the resilient member is sealed in a housing, as shown in FIGS. 2 and 3. This technology is disclosed in Japanese Patent Application Publication No. 2002-213960.

The gyroscope 1' is composed of an oscillator 12 having a base 18 supporting an oscillating piece 14 (FIG. 3) by means of a supporting pin 16, wherein the oscillating piece 14 includes electrodes bonded to an outer surface by a piezoelectric element; a PCB 24 fixing resilient lead frames 20 of the base 18 to electrode pads 24a by soldering and having chip type electronic elements mounted thereon; resilient members 22 receiving the base 18 to prevent noise, vibration etc. from being transmitted to the base 18; and a stem 26 having a plurality of input/output lead pins 28.

The PCB 24, the resilient members 22 and the stem 26 are integrally fixed by disposing the resilient members 22 between the PCB 24 and the stem 26 and by soldering first ends of the lead pins 28 to through holes 24b of the PCB 24.

An upper cover 30 is fixed on the stem 26 by welding so as to seal the PCB 24 and the resilient members 22.

This conventional gyroscope 1' does not bring the upper cover 30 into contact with the resilient members 22, so that, when the upper cover 30 is fixed, the oscillator 12 protected by the resilient members 22 is not pressed and displaced. Thus, there is an advantage in that, after the upper cover 30 is fixed, the gyroscope does not generate a change in output. However, the resilient members 22 should be separately fabricated, and also separate processes of maintaining the resilient members 22 between the PCB 24 and the stem 26 and of soldering the first ends of the lead pins 28 to the through holes of the PCB 24 in order to install the resilient members 22 are required, so that there is a problem in that the gyroscope has difficulty of assembling and increase of production costs.

Further, in the conventional gyroscope 1', the lead pins 28, which are fixed to the stem 26, are directly fixed to the PCB 24, so that when any disturbance takes place, the disturbance is directly transmitted to the PCB without being isolated. Thus, the oscillator 12 generates displacement by means of translational acceleration, thus causing undesired signals to be detected.

SUMMARY OF THE INVENTION

Therefore, it is an aspect of the present invention to provide a small structure using a bonding wire to prevent vibration and a method for fabricating the same.

It is another aspect of the present invention to providing a small structure using a bonding wire for supporting a floating body.

According to another aspect of the present invention, there is provided a small structure comprising a floating body having a plurality of first contact pads, a base having a plurality of second contact pads, and a plurality of bonding wires electrically connecting the first and second contact pads and elastically supporting the floating body so as to maintain the floating body over the base in a floated state in which the floating body is spaced apart from the base at a predetermined interval.

In an exemplary embodiment, the bonding wires are formed of one of gold and aluminum.

The small structure forms a gyroscope having a structure where the floating body includes at least one mass and at least one electrode driving the mass, and where the base includes a circuit for controlling operation of the mass and for converting displacement of the floating body into capacitance.

Alternatively, the small structure may form a gyroscope having a structure where the floating body includes at least one mass, at least one electrode driving the mass, and a first circuit for controlling operation of the mass and for converting displacement of the floating body into capacitance, and where the base includes a second circuit for controlling the first circuit.

Further, the small structure may form an accelerometer having a structure where the floating body includes at least one mass and at least one piezoelectric element converting displacement of the floating body into electric charge, and where the base includes a circuit for detecting a quantity of electric charges of the piezoelectric element.

According to another aspect of the present invention, there is provided a small structure, comprising a floating body, a base, and a plurality of bonding wires elastically supporting the floating body so as to maintain the floating body over the base in a floated state spaced apart at a predetermined interval.

In an exemplary embodiment, the bonding wires are formed of one of gold and aluminum.

The small structure forms a mirror having a structure where the floating body includes a conductive plate having a reflective surface formed on one surface thereof, and where the base includes a plurality of electrodes formed opposite to the floating body and attracting a corresponding portion of the floating body with an electrostatic force when a voltage is applied.

According to yet another aspect of the present invention, there is provided a method of fabricating a small structure, comprising the operations of: preparing a base; forming a sacrificial layer on the base; disposing a floating body on the sacrificial layer; connecting the base and the floating body with bonding wires; and removing the sacrificial layer.

In an exemplary embodiment, the operation of forming the sacrificial layer is performed by covering one of a photoresist and a polymer having a higher etching selective ratio than the base on a portion of the base where the floating body is to be located at a predetermined thickness.

The operation of removing the sacrificial layer is performed by removing the sacrificial layer by means of an etching process.

The operation of connecting the base and the floating body with the bonding wires is performed by connecting the base and the floating body using the bonding wires formed of one of gold and aluminum.

Alternatively, the operation of forming the sacrificial layer may be performed by covering a sublimatable material on a portion of the base where the floating body is to be located at a predetermined thickness. The sublimatable material may make use of p-dichlorobenzene. At this time, the operation of removing the sacrificial layer is performed by leaving and sublimating the sacrificial layer of the sublimatable material at a room temperature, or by sublimating the sacrificial layer of the sublimatable material under a predetermined condition for accelerating sublimation.

According to yet still another aspect of the present invention, there is provided a method of fabricating a small structure, comprising the operations of: preparing a base; disposing a spacer jig on the base; disposing a floating body on the spacer jig; connecting the base and the floating body with bonding wires; and removing the spacer jig.

In an exemplary embodiment, the operation of disposing the spacer jig on the base is performed by disposing the spacer jig having a predetermined thickness on a portion of the base where the floating body is to be located.

The operation of connecting the base and the floating body with the bonding wires is performed by connecting the base and the floating body using the bonding wires formed of one of gold and aluminum.

According to yet still another aspect of the present invention, there is provided a method of fabricating a small structure, comprising the operations of: preparing a base; disposing a temporary adhesive layer on the base; disposing a floating body on the temporary adhesive layer; connecting the base and the floating body by means of bonding wires; and lifting the floating body from the base by using a tool.

In an exemplary embodiment, the operation of disposing the temporary adhesive layer on the base is performed by disposing a double sided tape having a predetermined adhesive force on a portion of the base where the floating body is to be located.

The operation of connecting the base and the floating body with the bonding wires is performed by connecting the base and the floating body using the bonding wires formed of one of gold and aluminum.

The operation of floating the floating body from the base using the tool is performed by floating the floating body adhered to the base by the temporary adhesive layer from the base by a predetermined interval by attaching a vacuum chuck on the floating body to apply a vacuum force.

BRIEF DESCRIPTION OF THE DRAWINGS

The above and other aspects of the present invention will be more apparent by describing exemplary embodiments of the present invention with reference to the accompanying drawings, in which.

DETAILED DESCRIPTION OF THE EXEMPLARY EMBODIMENTS

Figure 1:
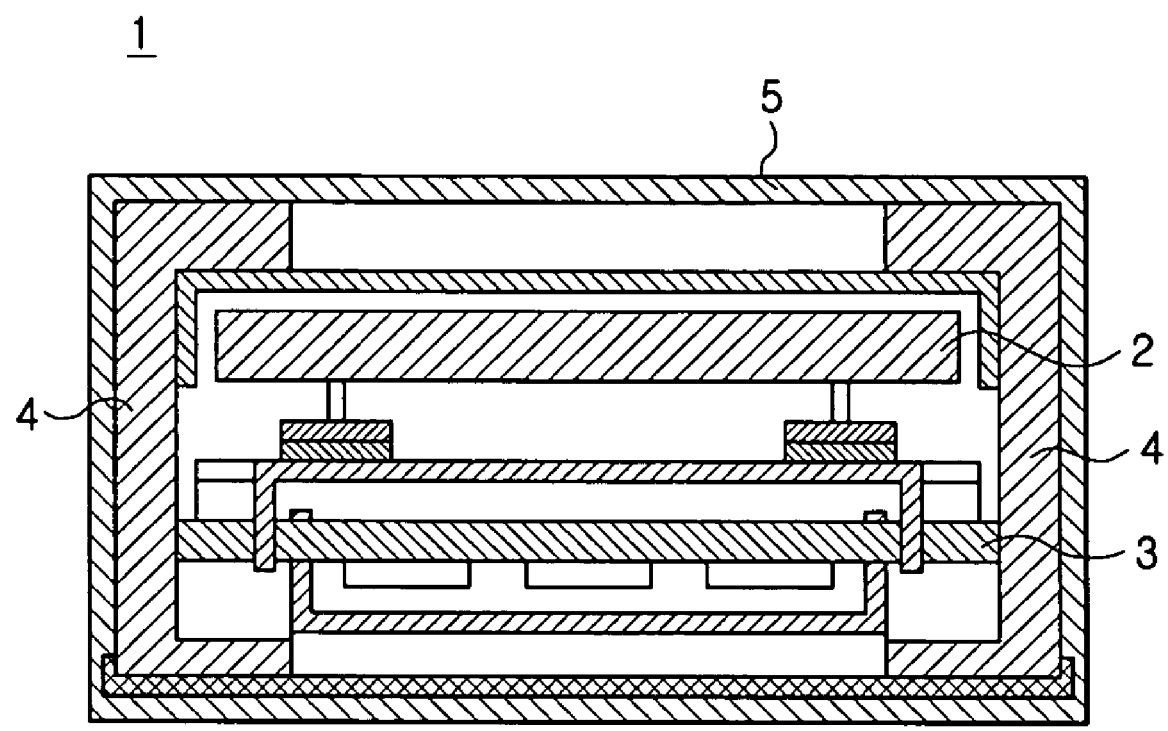
FIG. 1 is a cross-sectional view of a conventional gyroscope.
Figure 2:
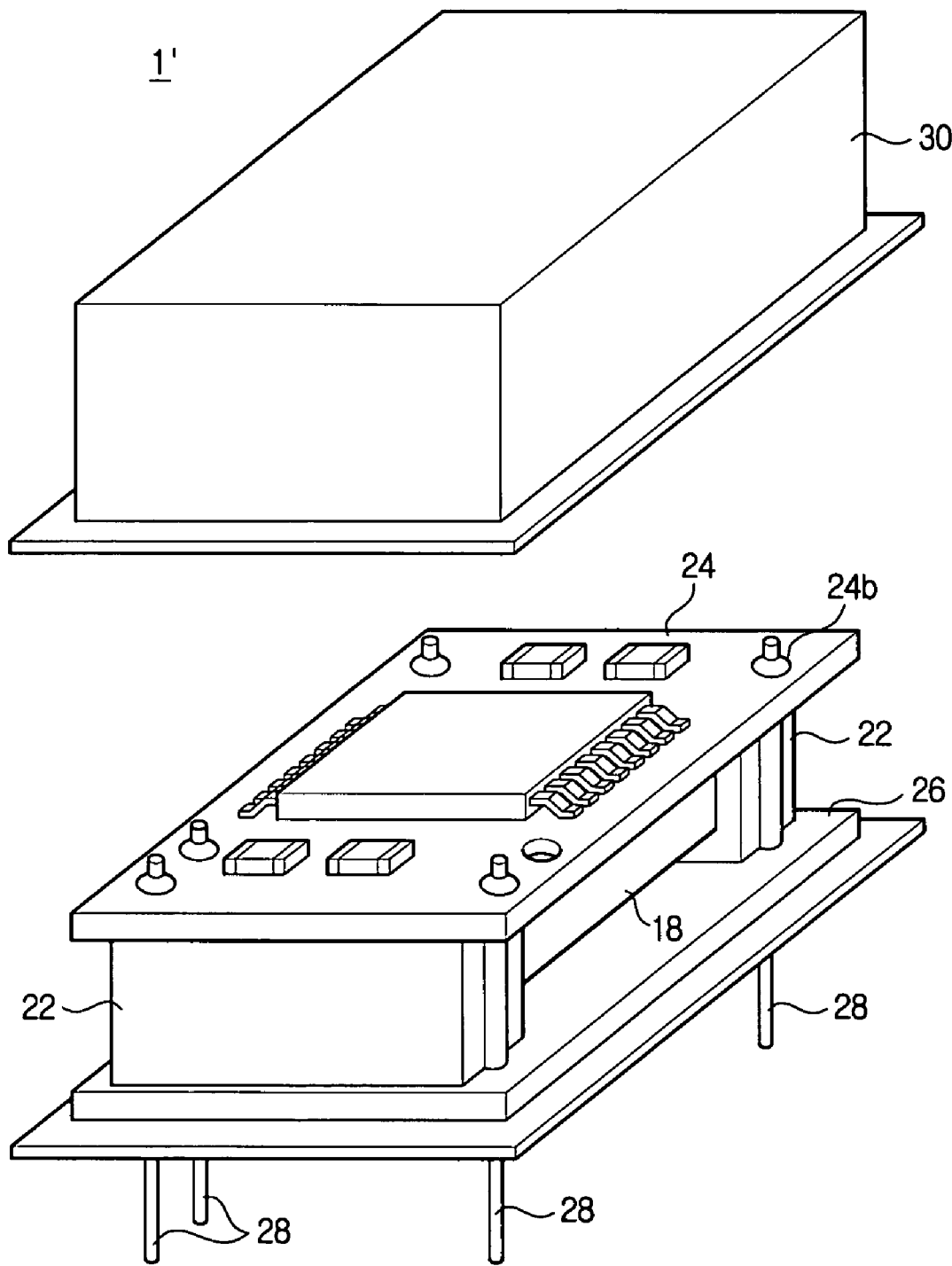
FIG. 2 is an exploded perspective view of another conventional gyroscope.
Figure 3:
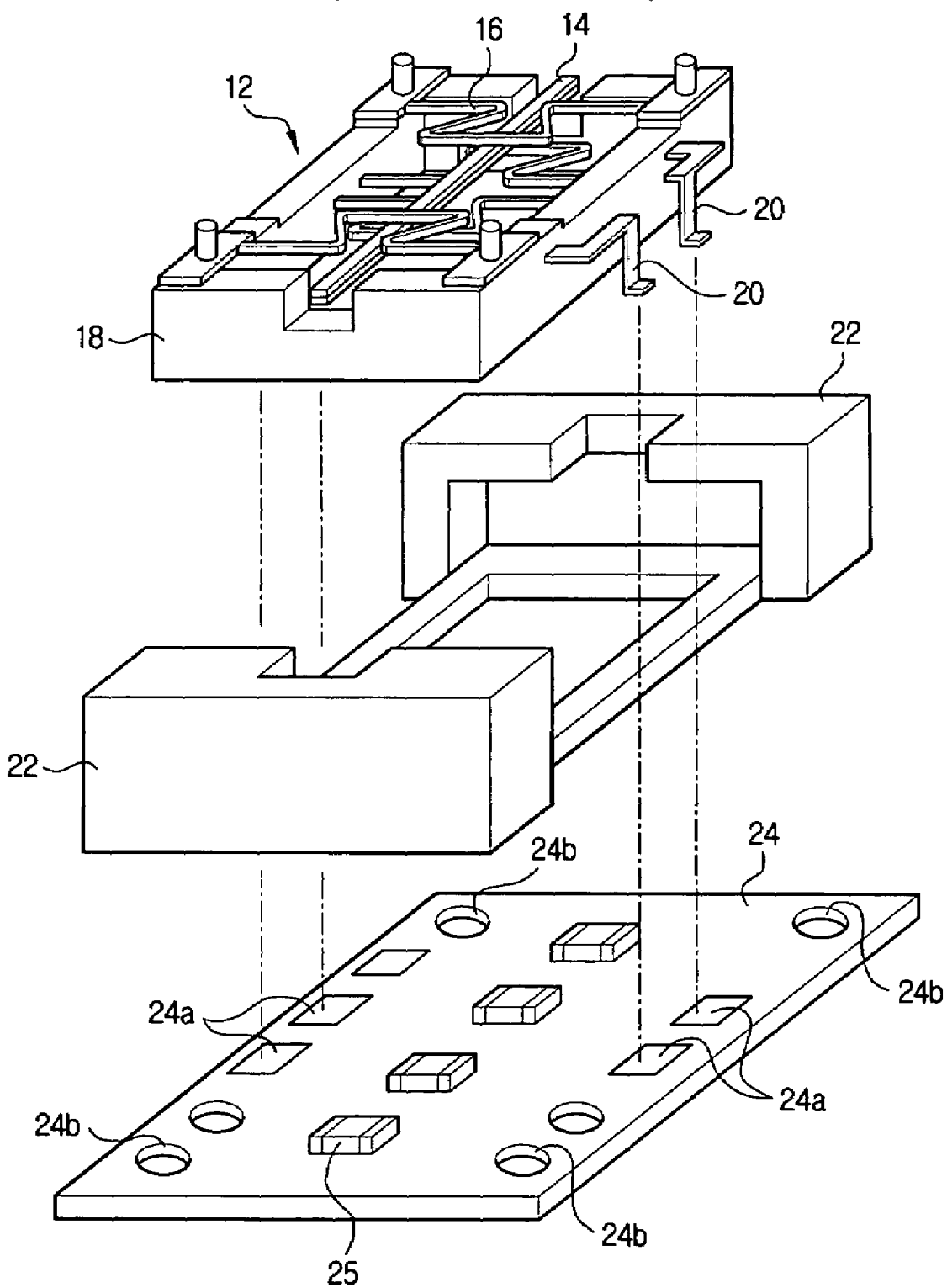
FIG. 3 is an exploded perspective view of a portion of the gyroscope shown in FIG. 2.

Hereinafter, a detailed description will be made about a developing apparatus and image forming equipment having the same according to exemplary embodiments of the invention with reference to the accompanying drawings.

In the following description, same drawing reference numerals are used for the same elements even in different drawings. The matters defined in the description such as a detailed construction and elements are provided to assist in a comprehensive understanding of the invention. Thus, it is apparent that the present invention can be carried out without those defined matters. Also, well-known functions or constructions are not described in detail since they would obscure the invention in unnecessary detail.

Figure 4:
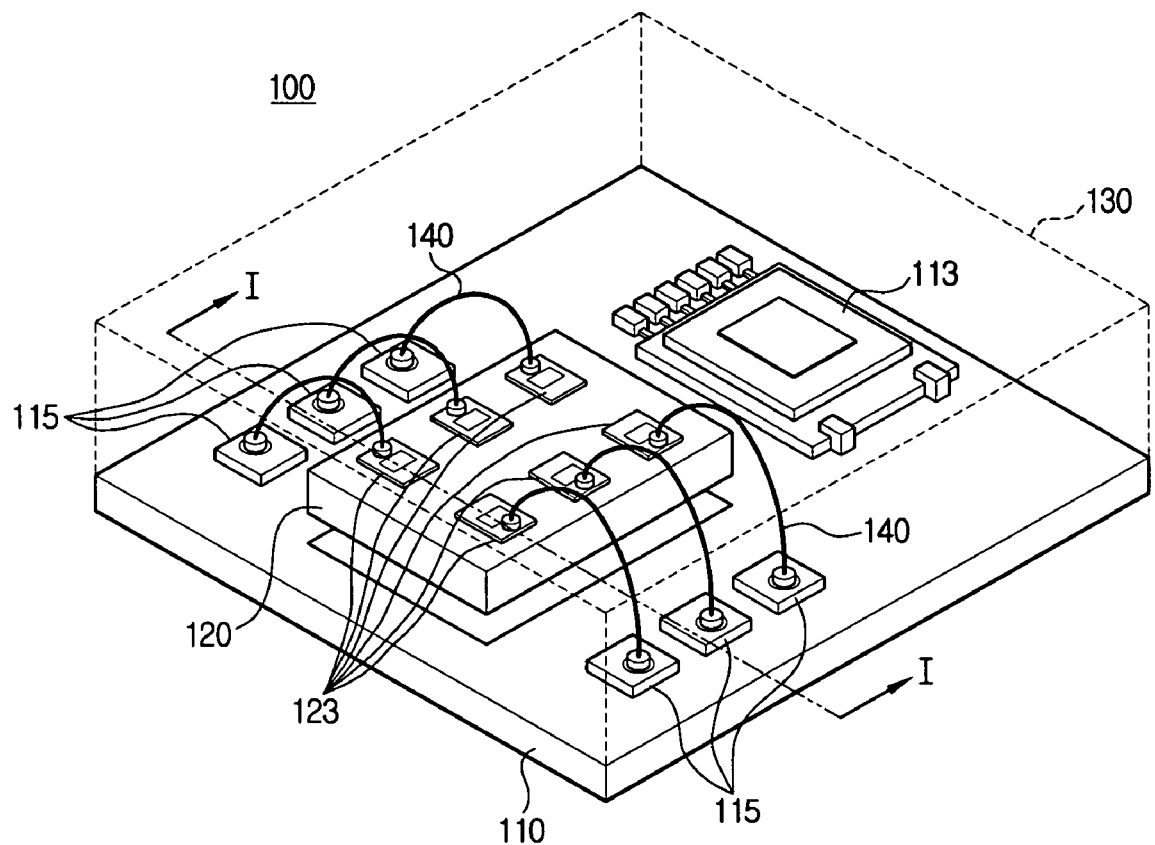
FIG. 4 is a perspective view of a gyroscope constituting a small structure according to a first exemplary embodiment of the present invention.

FIG. 4 shows a gyroscope 100 constituting a small structure according to a first exemplary embodiment of the present invention.

The gyroscope 100 includes a floating body 120, a base 110, a plurality of bonding wires 140 interconnecting the floating body 120 and the base 110, and a housing 130.

Figure 5:
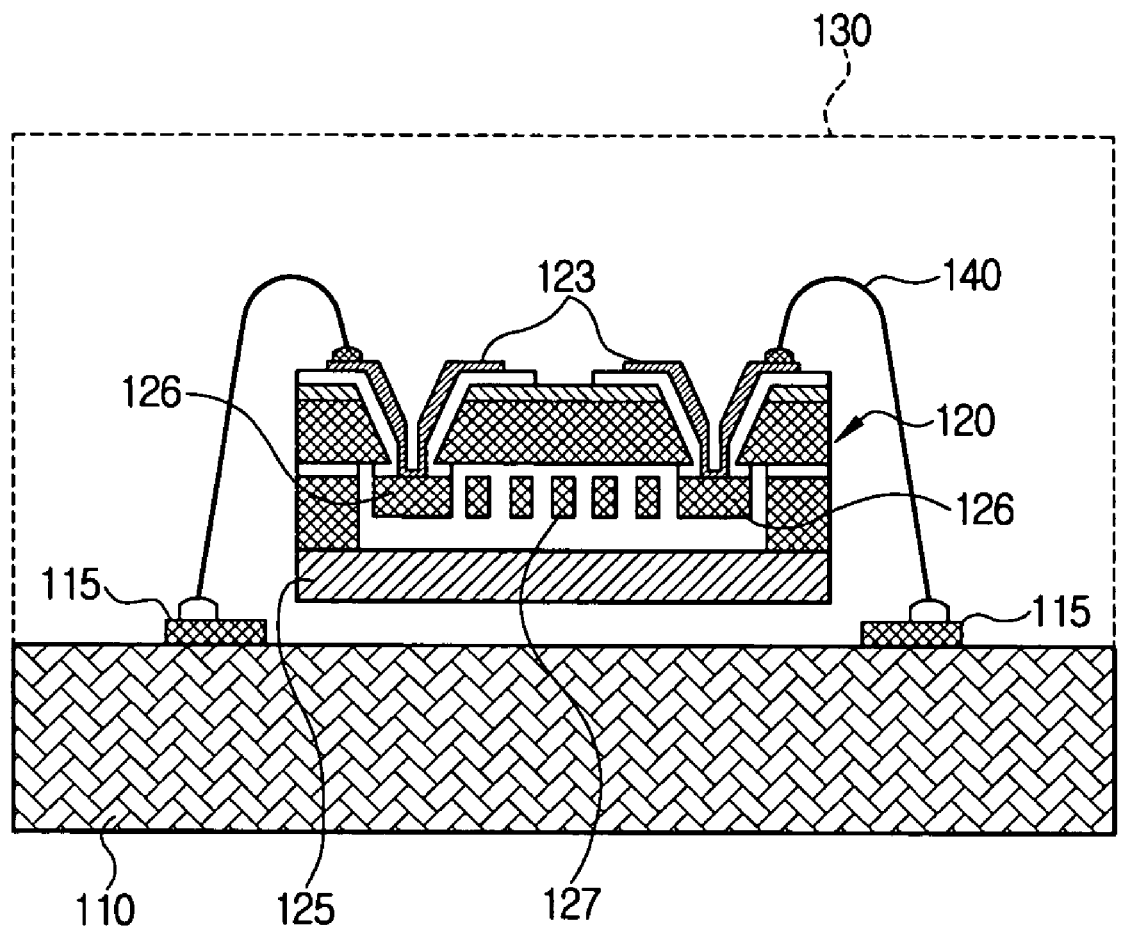
FIG. 5 is a cross-sectional view of a gyroscope taken along line I-I of FIG. 4.

As shown in FIG. 5, the floating body 120 includes a floating substrate 125 spaced apart from the base 110 at a predetermined interval, for example, between several microns and several millimeters, a plurality of oscillators or masses 127 floated over the floating substrate 125, and a plurality of electrodes 126 connected electrically with the masses 127 and having first contact pads 123. The floating body 120 is generally known, and so its detailed description will be omitted.

The base 110 comprises a substrate having a plurality of second contact pads 115 connected with the first contact pads 123 of the electrodes 126 with the bonding wires 140, and a circuit 113 controlling driving of the masses 127 and converting displacements of the masses 127 into capacitances to thus calculate angular velocities.

The bonding wires 140 are bonded to the first and second contact pads 123 and 115, and serve to electrically connect the floating body 120 with the base 110. Specifically, the bonding wires 140 serve to prevent and isolate the floating body 120 from a disturbance, such as impact, vibration etc., generated from a target (not shown) which is intended to measure an angular velocity in a state where the floating body 120 is supported and maintained over the base 110 in a floated state spaced apart at an interval between several microns and several millimeters.

The bonding wires 140 are formed of a material having electrical conductivity such as gold, aluminum, etc.

The bonding wires 140 have a diameter selected within a range from several microns to tens of microns in consideration of their total number so as to make it possible to support a weight of the floating body 120 and simultaneously to prevent and isolate the disturbance.

The housing 130 is disposed on the base 110, and seals the floating body 120, the circuit 113 and the bonding wires 140, all of which are disposed on the base 110.

In this manner, the gyroscope 100 of the first exemplary embodiment of the present invention is constructed so that, when the disturbance such as impact, vibration, etc. is transmitted to the base 110, the bonding wires 140 absorb the disturbance, and thus the disturbance is not transmitted to the masses 127 of the floating body 120. Thus, the gyroscope 100 is capable of detecting the angular velocity without being influenced by the disturbance.

A method of fabricating the gyroscope 100, configured as above, of the first exemplary embodiment of the present invention will be described in detail with reference to FIGS. 6A to 6E, as follows.

Figure 6A:
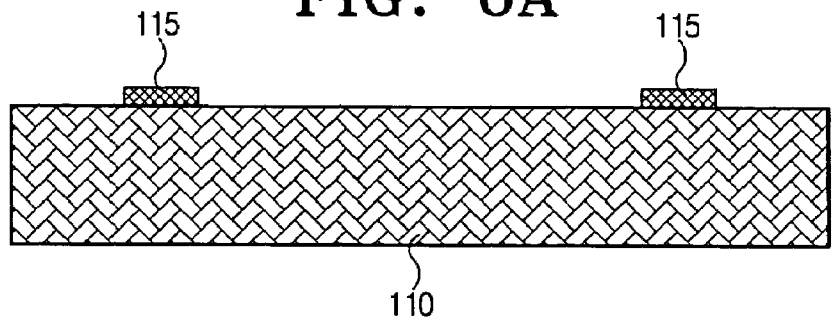
FIGS. 6A to 6E are process views illustrating a method of fabricating the gyroscope shown in FIG. 4.

First, as shown in FIG. 6A, the base 110 formed of a substrate having second contact pads 115 and a circuit 113 (FIG. 4) is prepared.

Figure 6B:
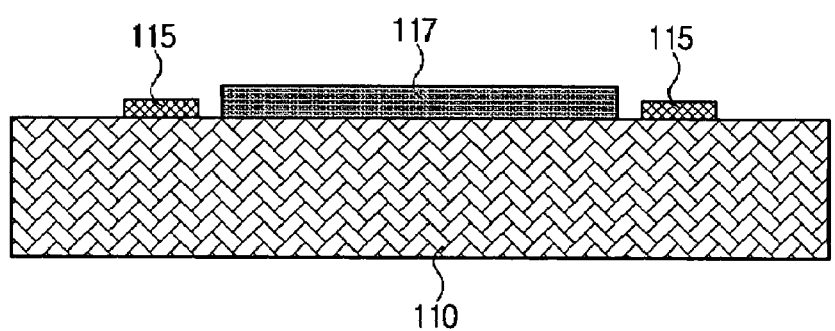

Then, as shown in FIG. 6B, a sacrificial layer 117 is formed on the base 110. The sacrificial layer 117 is formed by covering a photoresist or polymer, which has a higher etching selective ratio than the base 110, on a portion of the base 110 where a floating body 120 is to be located at a predetermined thickness, for example, between several microns and several millimeters.

At this time, because other portions exclusive of the portion of the base 110 where the floating body 120 is to be located are masked, the sacrificial layer is not formed on the other portions. The thickness of the sacrificial layer 117 becomes an interval between the base 110 and the floating body 120.

Alternatively, the sacrificial layer 117 may be formed by heating a sublimatable material at a predetermined temperature and by covering the heated material on the portion of the base 110 where the floating body 120 is to be located at a thickness ranging from several microns to several millimeters. Here, the sublimatable material may use p-dichlorobenzene which is changed into a liquid when being heated at a predetermined temperature and into a solid at a room temperature.

Figure 6C:
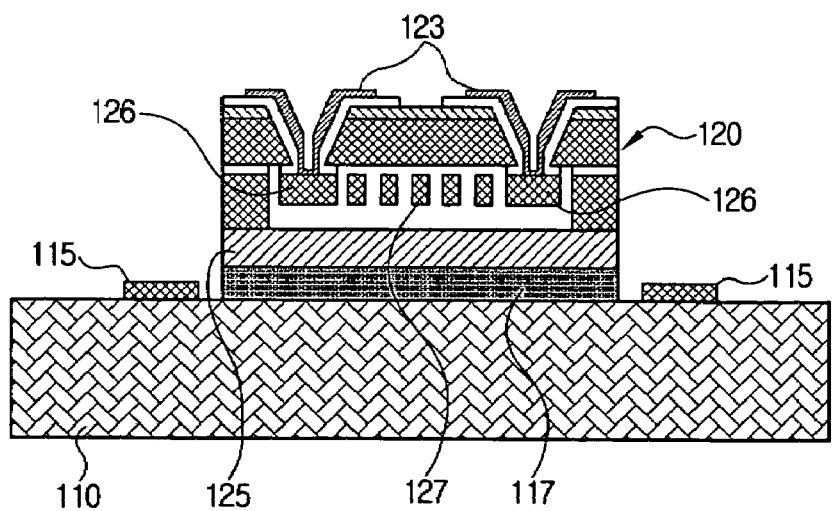

Subsequently, as shown in FIG. 6C, the floating body 120 prepared in advance is disposed on the sacrificial layer 117.

Figure 6D:
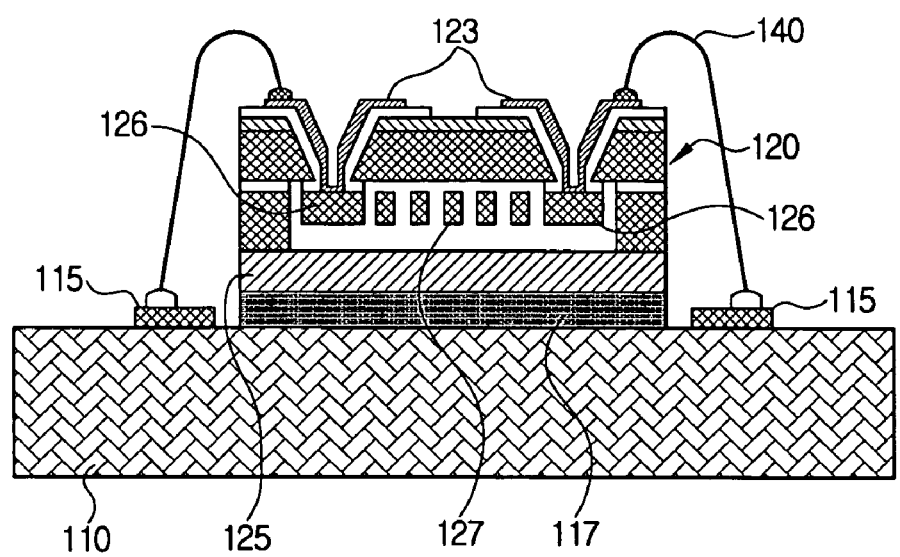
Figure 6E:
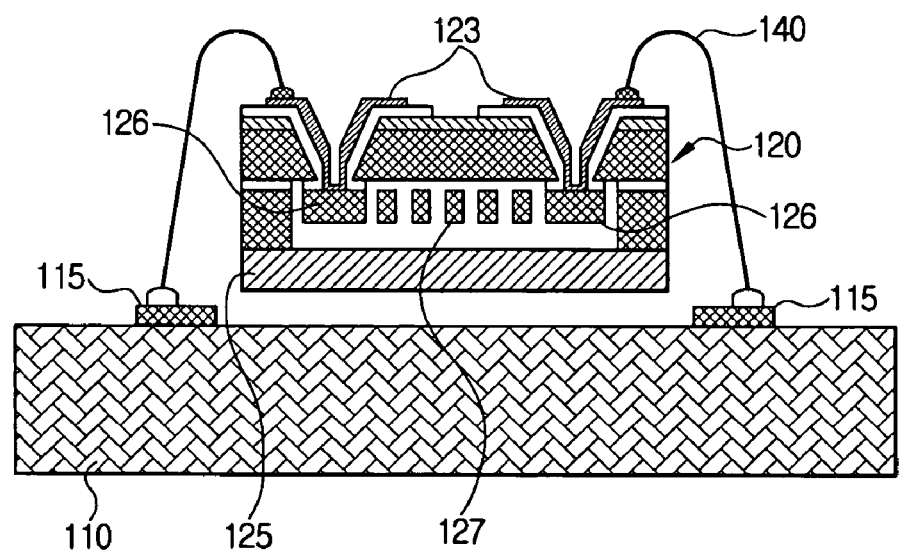

Further, as shown in FIG. 6D, bonding wires 140 are bonded, by soldering, to first contact pads 123 of the floating body 120 and the second contact pads 115 of the base 110. In this case, the bonding wires 140 make use of a wire which has a thickness ranging from several microns to tens of microns and is formed of gold or aluminum.

Thereafter, the sacrificial layer 117 is removed by a dry or wet etching process.

Here, when the sacrificial layer 117 is formed of the sublimatable material, the sacrificial layer 117 may be left at a room temperature for a predetermined time without a separate process, or removed by sublimation into a gas under a predetermined condition capable of accelerating the sublimation.

Then, when the housing 130 is positioned on the base 110 and is fixed by a fixing element such as a screw or an adhesive, the fabrication of the gyroscope 100 is completed.

FIGS. 7A to 7E show processes of another method of fabricating the gyroscope 100 of the first exemplary embodiment of the present invention.

This method is similar to the method of fabricating the gyroscope 100 described with reference to FIGS. 6A to 6E, except that a spacer jig 118 is used in place of the sacrificial layer 117 in order to separate the floating body 120 from the base 110 at a predetermined interval.

Figure 7A:
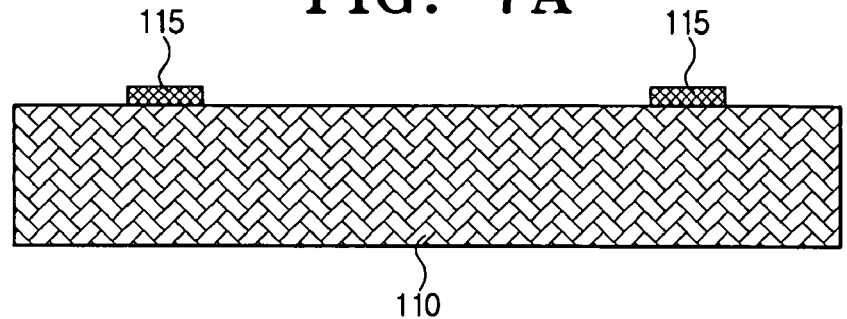
FIGS. 7A to 7E are process views illustrating another method of fabricating the gyroscope shown in FIG. 4.

To be more specific, first, as shown in FIG. 7A, a base 110 formed of a substrate having second contact pads 115 and circuit 113 (FIG. 4) is prepared.

Figure 7B:
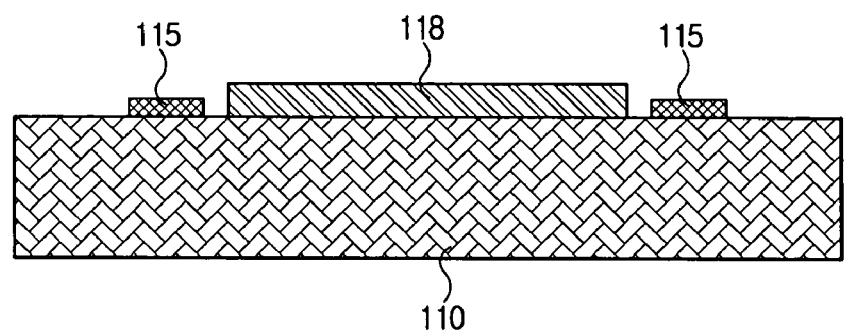

Then, as shown in FIG. 7B, a spacer jig 118 is formed on a portion of the base 110 where the floating body 120 is intended to be located. The spacer jig 118 has a predetermined thickness, for example, between several microns and several millimeters. This thickness becomes an interval between the base 110 and the floating body 120 in future.

Figure 7C:
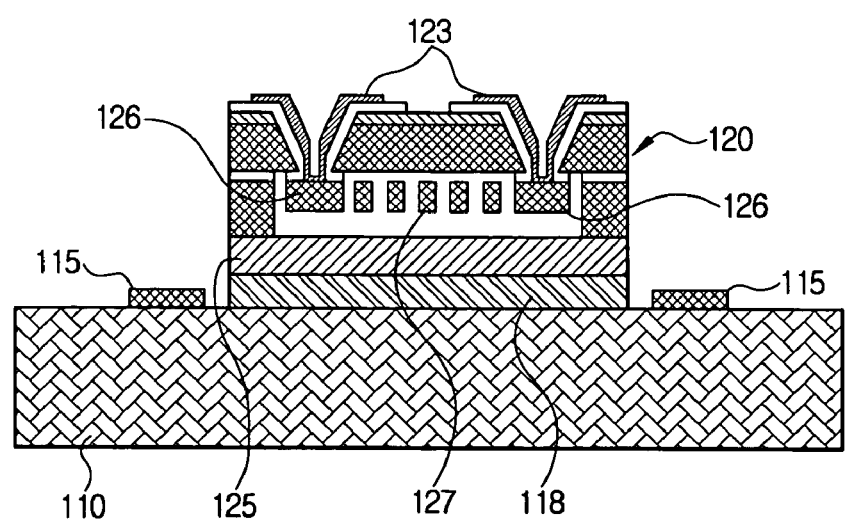

Subsequently, as shown in FIG. 7C, a floating body 120, which was previously prepared, is disposed on the spacer jig 118.

Figure 7D:
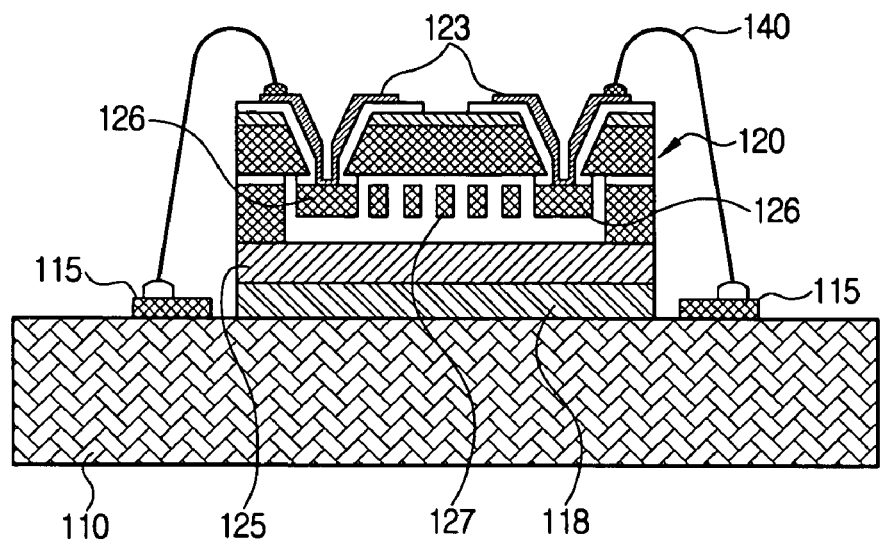
Figure 7E:
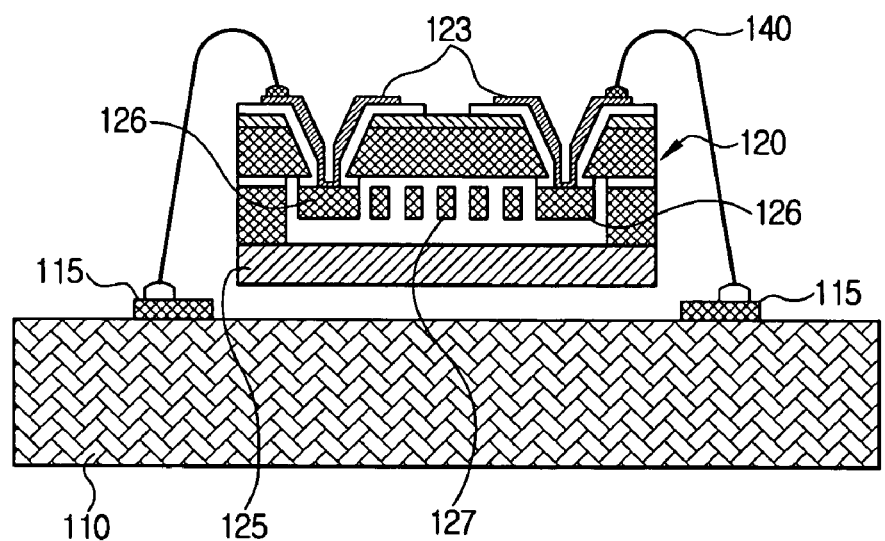

And, as shown in FIG. 7D, bonding wires 140 are bonded, by soldering, to the first contact pads 123 of the floating body 120 and the second contact pads 115 of the base 110. In this case, the bonding wires 140 make use of a wire which has a diameter ranging from several microns to tens of microns and is formed of gold or aluminum.

Subsequently, the spacer jig 118 is removed from the base 110.

Thereafter, when the housing 130 is positioned on the base 110 and is fixed by a fixing element such as a screw or an adhesive, the fabrication of the gyroscope 100 is completed.

FIGS. 8A to 8E show processes of yet another method of fabricating the gyroscope 100 of the first exemplary embodiment of the present invention.

This method is similar to the method of fabricating the gyroscope 100 described with reference to FIGS. 6A to 6E and FIGS. 7A to 7E, except that a tool (not shown) such as a vacuum chuck is used to lift the floating body 120, which is connected to the base 110 by the bonding wires 140, from the base 110 in place of the sacrificial layer 117 and the spacer jig 118 in order to separate the floating body 120 from the base 110 at a predetermined interval.

Figure 8A:
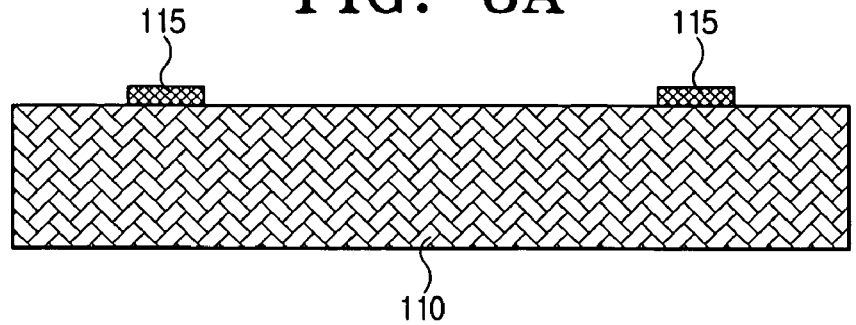
FIGS. 8A to 8F are process views illustrating yet another method of fabricating the gyroscope shown in FIG. 4.

To be more specific, first, as shown in FIG. 8A, the base 110 formed of a substrate having second contact pads 115 and a circuit 113 (FIG. 4) is prepared.

Figure 8B:
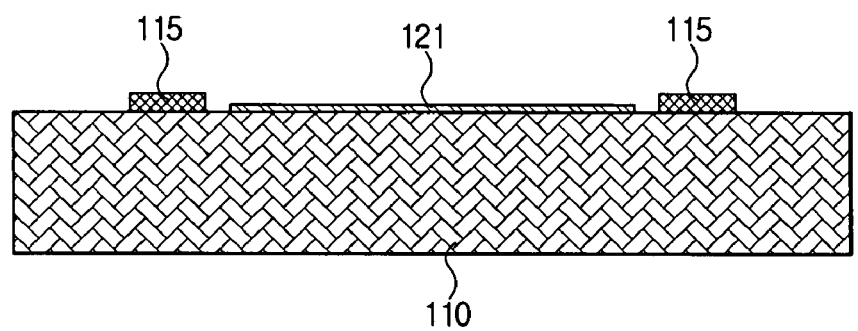

Subsequently, as shown in FIG. 8B, a temporary adhesive layer 121, such as a double sided tape, is formed on a portion of the base 110 where the floating body 120 is to be located.

Figure 8C:
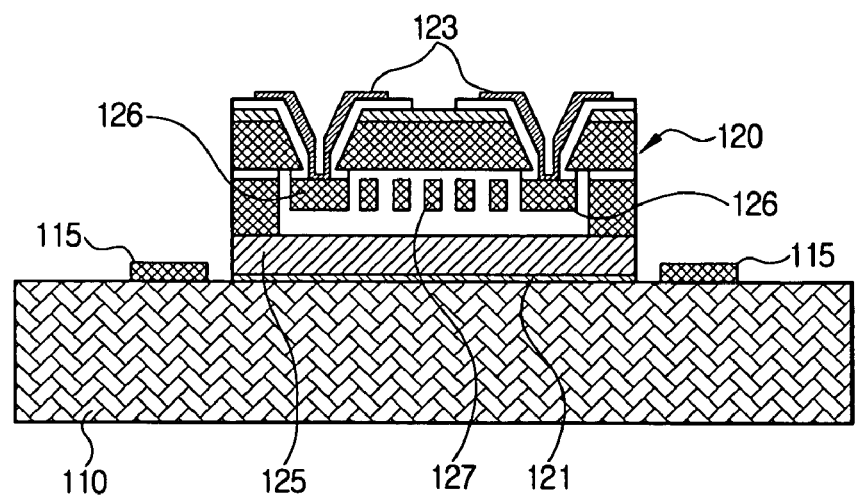

Then, as shown in FIG. 8C, the floating body 120 prepared in advance is disposed on the temporary adhesive layer 121.

Figure 8D:
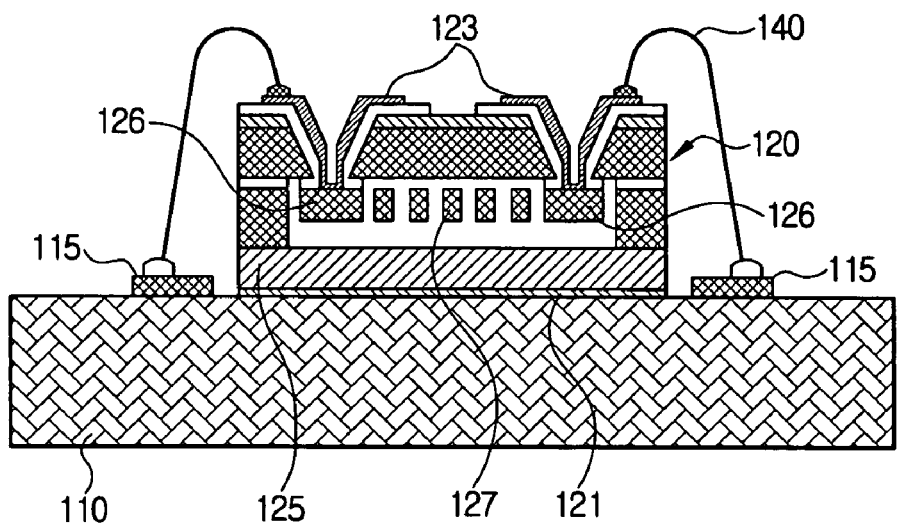

And, as shown in FIG. 8D, bonding wires 140 are bonded, by soldering, to first contact pads 123 of the floating body 120 and the second contact pads 115 of the base 110. In this case, the bonding wires 140 make use of a wire which has a diameter ranging from several microns to tens of microns and is formed of gold or aluminum.

Figure 8E:
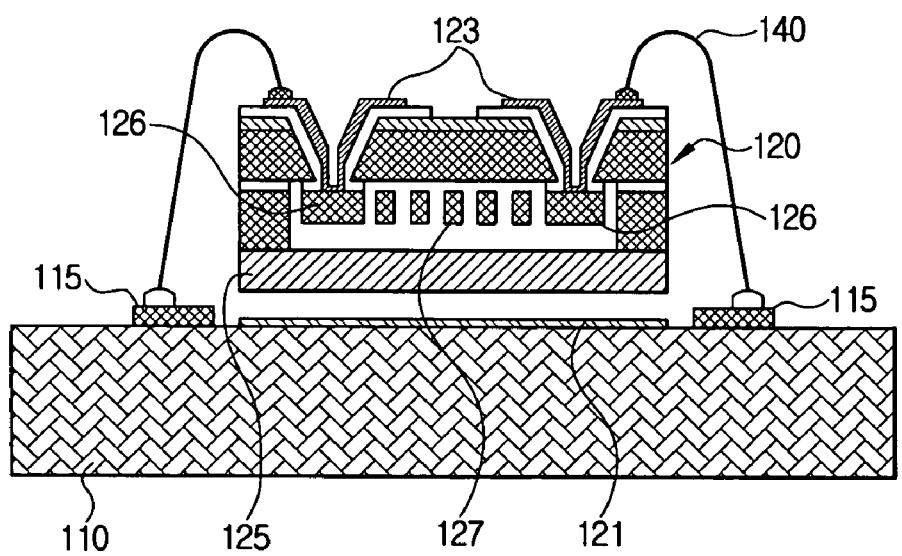
Figure 8F:
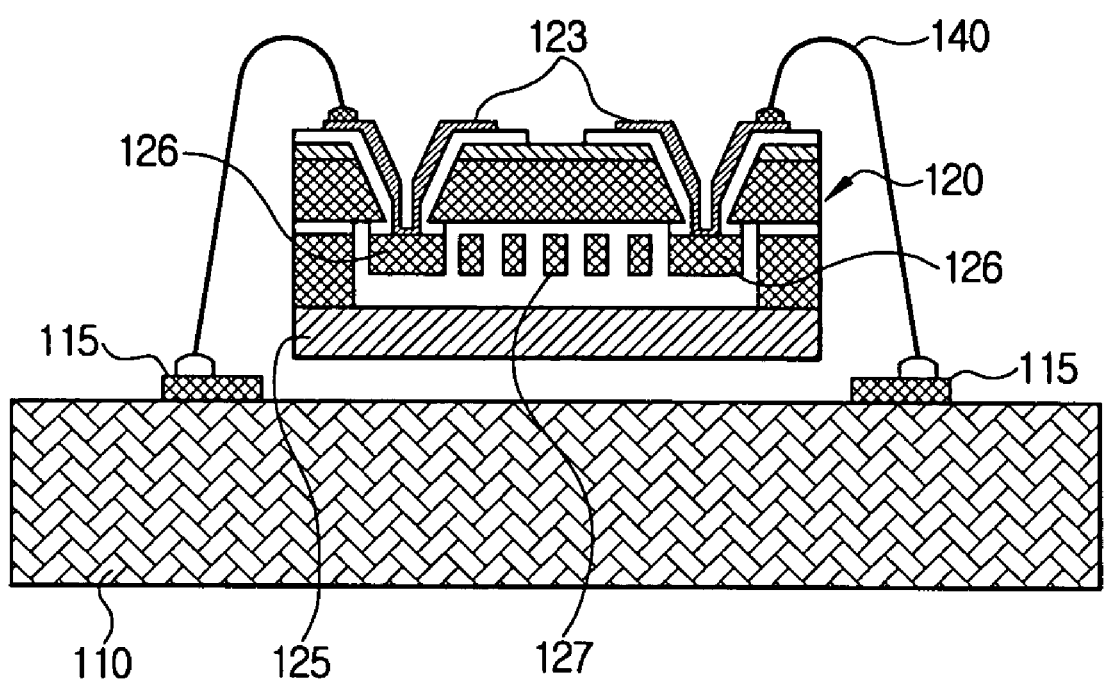

Subsequently, as shown in FIG. 8E, the floating body 120 is lifted from the base 110 by a predetermined interval, for example, between several microns and several millimeters by the tool, such as a vacuum chuck. At this time, the vacuum chuck is attached on the floating body 120 and separates the floating body 120 from the base 110 using a vacuum force.

Then, the temporary adhesive layer 121 is removed from the base 110.

Thereafter, when the housing 130 is positioned on the base 110 and is fixed by a fixing element such as a screw or an adhesive, the fabrication of the gyroscope 100 is completed.

Figure 9:
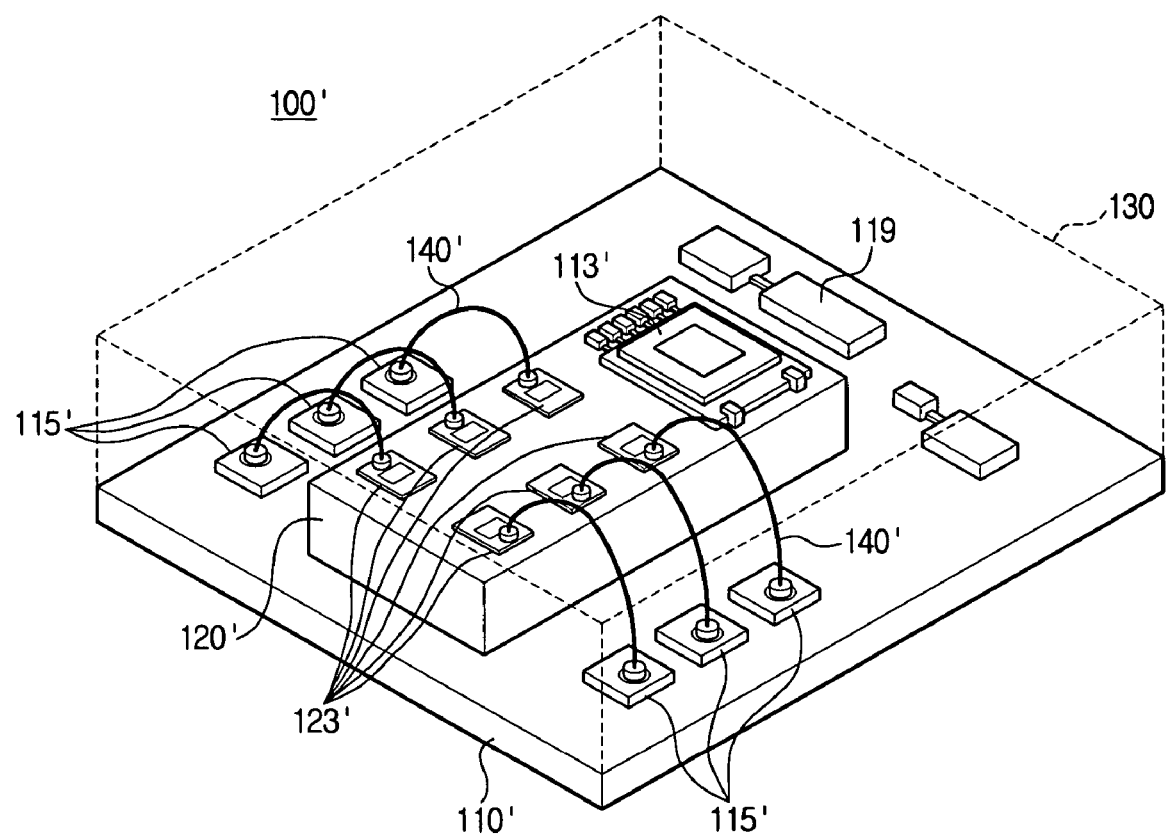
FIG. 9 is a perspective view of a gyroscope constituting a small structure according to a second exemplary embodiment of the present invention.

FIG. 9 shows a gyroscope 100' constituting a small structure according to a second exemplary embodiment of the present invention.

The gyroscope 100' has the same configuration as the gyroscope 100 of the first embodiment described with reference to FIGS. 4 and 5, except for a floating body 120' and a base 110'. Thus, a description about a configuration exclusive of the floating body 120' and the base 110' will be omitted.

The floating body 120' includes a floating substrate (not shown), which is spaced apart from the base 110' at a predetermined interval, for example, between several microns and several millimeters, a plurality of masses (not shown) which float over the floating substrate, a plurality of electrodes connected electrically with the masses and having first contact pads 123', and a circuit 113' controlling driving of the masses and converting displacements of the masses into capacitances to calculate angular velocities.

The base 110' comprises a substrate having second contact pads 115' connected with the first contact pads 123' with bonding wires 140', and a main circuit 119 controlling the circuit 113' of the floating body 120'.

The gyroscope 100', configured as above, of the second exemplary embodiment, like the gyroscope 100 of the first exemplary embodiment, is constructed such that, when the disturbance, such as vibration, etc., is transmitted to the base 110', the bonding wires 140' absorb the disturbance, and thus the disturbance is not transmitted to the floating body 120'. Thus, the gyroscope 100' is capable of detecting the angular velocity without being influenced by the disturbance.

A method of fabricating the gyroscope 100' of the second exemplary embodiment is similar to the method of fabricating the gyroscope 100 of the first exemplary embodiment with reference to FIGS. 6A to 6E, FIGS. 7A to 7E, and FIGS. 8A to 8F, and thus its detailed described will be omitted here.

Figure 10:
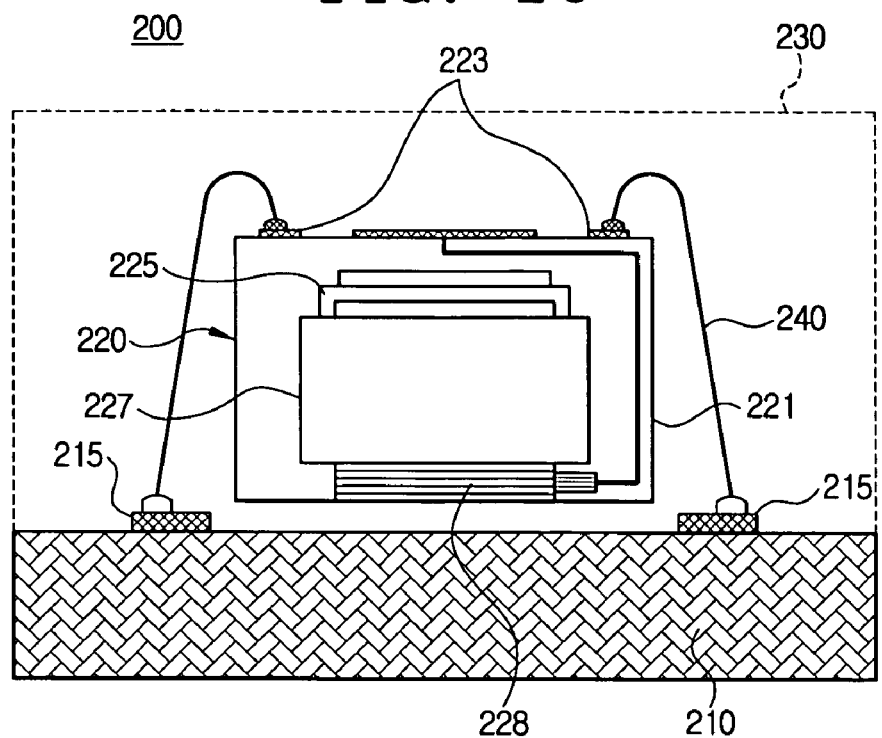
FIG. 10 is a perspective view of an accelerometer constituting a small structure according to a third exemplary embodiment of the present invention.

FIG. 10 shows an accelerometer 200 constituting a small structure according to a third exemplary embodiment of the present invention.

The accelerometer 200 includes a floating body 220, a base 210, a plurality of bonding wires 240 interconnecting the floating body 220 and the base 210, and a housing 230.

The floating body 220 includes at least one mass 227, at least one spring 225 elastically supporting the mass 227, at least one piezoelectric element 228 disposed to be compressed and released according to displacement of the mass 227, and a case 221 having a plurality of first contact pads 223 connected to the piezoelectric elements 228 thereon. The piezoelectric elements 228 generate electric charges when being compressed and released according to displacement of the mass 227.

The base 210 comprises a substrate having at least one second contact pad 215 connected with the first contact pads 223 by the bonding wires 240, and a circuit (not shown) which detects variation of the electric charges generated according to compression and release of the piezoelectric elements 228.

The bonding wires 240 are bonded to the first and second contact pads 223 and 215, and serve to electrically connect the floating body 220 with the base 210, namely serve to prevent and isolate the floating body 220 from a disturbance, such as impact, vibration etc. in a state where the floating body 220 is supported and maintained over the base 210 in a floated state spaced apart at an interval between several microns and several millimeters.

Like those of the gyroscope 100 of the first exemplary embodiment, the bonding wires 240 are formed of a material having electrical conductivity such as gold, aluminum, etc. and have a diameter which is selected within a range from several microns to tens of microns on the basis of their total number so as to support a weight of the floating body 220 and simultaneously to prevent and isolate the disturbance.

The housing 230 is disposed on the base 210, and seals the floating body 220 and the bonding wires 240 which are disposed on the base 210.

Like the gyroscope 100 of the first exemplary embodiment, the accelerometer 200, configured as above, of the third exemplary embodiment of the present invention is constructed so that, when the disturbance such as impact, vibration, etc., is transmitted to the base 210, the bonding wires 240 absorb the disturbance, and thus the disturbance is not transmitted to the floating body 220. Thus, accelerometer 200 is capable of detecting the angular velocity without being influenced by the disturbance.

A method of fabricating the accelerometer 200 of the third exemplary embodiment is similar to the method of fabricating the gyroscope 100 of the first exemplary embodiment with reference to FIGS. 6A to 6E, FIGS. 7A to 7E, and FIGS. 8A to 8F, and thus its detailed described will be omitted here.

Figure 11:
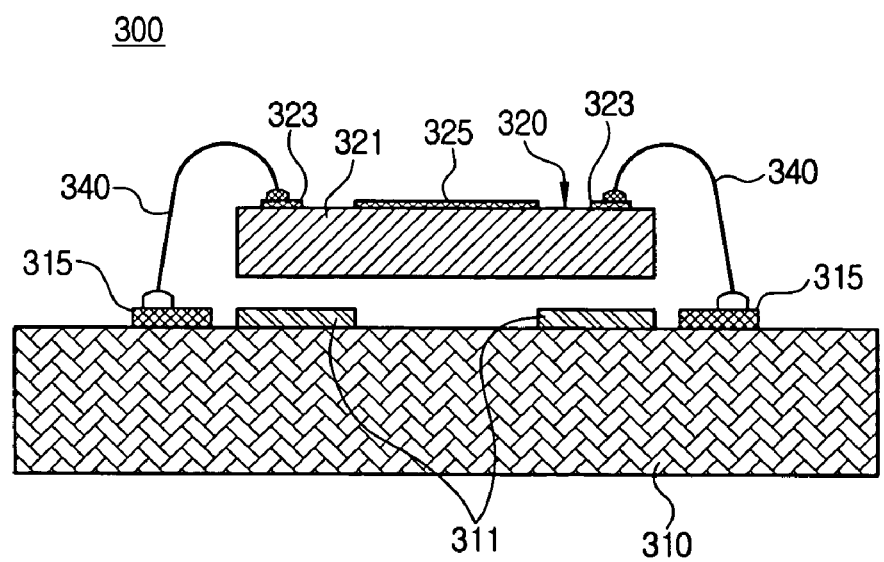
FIG. 11 is a perspective view of a micro-mirror constituting a small structure according to a fourth exemplary embodiment of the present invention.

FIG. 11 shows a micro-mirror 300 constituting a small structure according to a fourth exemplary embodiment of the present invention. This micro-mirror 300 reflects light and is installed to a head of a precision optical instrument which reads information.

The micro-mirror 300 includes a floating body 320, a base 310, and a plurality of bonding wires 340 interconnecting the floating body 320 and the base 310.

The floating body 320 is composed of a conductive plate 321 which is formed thereon with a reflective surface 325.

The base 310 comprises a substrate having a plurality of metal electrodes 311 formed opposite to the floating body 320 and disposed to attract the corresponding portion of the floating body 320 with an electrostatic force when a voltage is applied, and a circuit (not shown) controlling application of the voltage to the metal electrodes 311.

The bonding wires 340 are bonded to first bonding pads 323 of the floating body 320 and second bonding pads 315 of the base 310, and connect the floating body 220 with the base 210 to serve to elastically support the floating body 220 over the base 310 in a floated state spaced apart at an interval between several microns and several millimeters.

Like those of the gyroscope 100 of the first exemplary embodiment, the bonding wires 340 are formed of a material having electrical conductivity such as gold, aluminum, etc., and have a diameter selected within a range from several microns to tens of microns on the basis of their total number so as to support a weight of the floating body 220 and to be bound by the electrostatic force generated by the voltage applied to the metal electrodes 311 to thus fluctuate the floating body 320 in a leftward and rightward direction or in an upward and downward direction.

The micro-mirror 300, configured as above, of the fourth exemplary embodiment of the present invention is constructed so that the reflective surface 325 of the floating body 320 reflects the light by attracting the corresponding portion of the floating body 320 depending on the voltage applied to each of the metal electrodes 311 in the leftward and rightward direction or in the upward and downward direction to thus fluctuate the floating body 320.

A method of fabricating the micro-mirror 300 of the fourth exemplary embodiment is similar to the method of fabricating the gyroscope 100 of the first exemplary embodiment with reference to FIGS. 6A to 6E, FIGS. 7A to 7E, and FIGS. 8A to 8F, and thus its detailed described will be omitted here.

As set forth above, the small structure and its fabricating method according to aspects of the present invention makes use of the bonding wires connecting the floating body and the base to prevent disturbance or provide support without using a separate element to prevent disturbance or provide support, so that processes of fabricating and assembling separate resilient members are eliminated to facilitate assembly and fabrication, thereby providing reduced fabrication costs.

The foregoing exemplary embodiments are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A small structure comprising:
a floating body comprising:
   a floating substrate;
   at least one mass floated over the floating substrate and disposed inside the floating body; and
   a plurality of first contact pads;
a base which includes a plurality of second contact pads; and
a plurality of bonding wires, both ends of which are electrically connected to the first contact pads and the second contact pads, respectively, wherein the plurality of bonding wires elastically support the floating body and maintain the floating body over the base in a floated state in which the floating body is spaced apart from the base at a predetermined interval,
wherein the floating body is supported only by the plurality of bonding wires without any substrate or frame that is disposed between the base and the plurality of bonding wires to support a part of the bonding wires so that the bonding wires support the floating body, and
wherein all intermediate portions between the both ends of the plurality of bonding wires are not supported by any part of the base, the substrate or the frame, and do not directly or indirectly pass through the floating substrate, to elastically support the floating body connected to one of the both ends of the plurality of bonding wires.

2. The small structure as claimed in claim 1, wherein the bonding wires are formed of one of gold and aluminum.

3. The small structure as claimed in claim 1, wherein:
the small structure is a gyroscope;
the floating body includes at least one electrode which drives the mass which is an oscillator; and
the base includes a circuit which controls operation of the mass and converts displacement of the floating body into capacitance.

4. The small structure as claimed in claim 1, wherein:
the small structure is a gyroscope;
the floating body includes at least one electrode which drives the mass which is an oscillator, and a first circuit which controls operation of the mass and converts displacement of the floating body into a capacitance; and
the base includes a second circuit which controls the first circuit.

5. The small structure as claimed in claim 1, wherein:
the small structure is an accelerometer;
the floating body includes at least one mass and at least one piezoelectric element which converts displacement of the floating body into an electric charge; and
the base includes a circuit which detects a quantity of the electric charge of the piezoelectric element.

6. A small structure comprising:
a floating body comprising a floating substrate, and at least one mass floated over the floating substrate and disposed inside the floating body;
a base; and
a plurality of bonding wires which elastically support the floating body and maintain the floating body over the base in a floated state in which the floating body is spaced apart from the base at a predetermined interval,
wherein the floating body is supported only by the plurality of bonding wires without any substrate or frame that is disposed between the base and the plurality of bonding wires to support a part of the bonding wires so that the bonding wires support the floating body, and
wherein all intermediate portions between the both ends of the plurality of bonding wires are not supported by any part of the base, the substrate or the frame, and do not directly or indirectly pass through the floating substrate, to elastically support the floating body connected to one of the both ends of the plurality of bonding wires.

7. The small structure as claimed in claim 6, wherein the bonding wires are formed of one of gold and aluminum.

8. The small structure as claimed in claim 6, wherein:
the small structure is a mirror;
the floating body includes a conductive plate with a reflective surface which is formed on one surface of the conductive plate; and
the base includes a plurality of electrodes which are formed opposite to the floating body and which attract a corresponding portion of the floating body with an electrostatic force when a voltage is applied.

* * * * *